United States Patent
Zhu et al.

(10) Patent No.: US 11,295,953 B2
(45) Date of Patent: Apr. 5, 2022

(54) METHOD AND APPARATUS FOR MICROMACHINING SEMICONDUCTOR MATERIAL FROM OPPOSING SIDES THROUGH SYNCHRONOUS COORDINATION OF LASER AND ELECTROCHEMISTRY

(71) Applicant: JIANGSU UNIVERSITY, Zhenjiang (CN)

(72) Inventors: Hao Zhu, Zhenjiang (CN); Zhi Zhang, Zhenjiang (CN); Senshan Mao, Zhenjiang (CN); Shuaijie Zhu, Zhenjiang (CN); Zhaoyang Zhang, Zhenjiang (CN); Kun Xu, Zhenjiang (CN); Anbin Wang, Zhenjiang (CN); Douyan Zhao, Zhenjiang (CN)

(73) Assignee: JIANGSU UNIVERSITY, Zhenjiang (CN)

(*) Notice: Subject to any disclaimer, the term of this patent is extended or adjusted under 35 U.S.C. 154(b) by 0 days.

(21) Appl. No.: 17/257,328

(22) PCT Filed: Feb. 28, 2019

(86) PCT No.: PCT/CN2019/076416
§ 371 (c)(1),
(2) Date: Dec. 31, 2020

(87) PCT Pub. No.: WO2020/172835
PCT Pub. Date: Sep. 3, 2020

(65) Prior Publication Data
US 2021/0358756 A1    Nov. 18, 2021

(30) Foreign Application Priority Data
Feb. 25, 2019 (CN) .......................... 201910137952.0

(51) Int. Cl.
*H01L 21/268* (2006.01)
*C23C 18/12* (2006.01)
*C23C 14/08* (2006.01)

(52) U.S. Cl.
CPC ............ *H01L 21/268* (2013.01); *C23C 14/08* (2013.01); *C23C 18/12* (2013.01)

(58) Field of Classification Search
CPC .................................................. H01L 21/268
(Continued)

(56) References Cited

U.S. PATENT DOCUMENTS 4,283,259 A * 8/1981 Melcher ............... C23F 1/02
                                                      205/646
4,379,022 A    4/1983 Melcher et al.
(Continued)

FOREIGN PATENT DOCUMENTS

CN    1919514 A    2/2007
CN    101856753 A    10/2010
(Continued)

*Primary Examiner* — Vu A Vu
(74) *Attorney, Agent, or Firm* — Bayramoglu Law Offices LLC

(57) ABSTRACT

An apparatus for micromachining a semiconductor material from opposing sides through synchronous coordination of laser and electrochemistry includes an optical path system, a stable low-pressure jet generation system, and an electrolytic machining system. The optical path system includes a laser generator, a beam expander, a reflector, a galvanometer, and a lens. The electrolytic machining system includes a direct-current pulsed power supply, an adjustable cathode fixture, an electrolyte tank, a current probe, and an oscilloscope. The stable low-pressure jet generation system provides an electrolyte flow into a metal needle. The electrolyte flow forms an electrolyte layer between a semiconductor material and a cathode copper plate, such that the cathode and the anode are in electrical contact with each other. In a
(Continued)

method employing the apparatus, a laser beam is irradiated onto the semiconductor material to form a local high-temperature region, which leads to a localized increase in electrical conductivity.

10 Claims, 3 Drawing Sheets

(58) Field of Classification Search
USPC .......................................................... 438/795
See application file for complete search history.

(56) References Cited

U.S. PATENT DOCUMENTS

| | | | |
|---|---|---|---|
| 4,826,583 A * | 5/1989 | Biernaux | C25D 5/024 204/224 M |
| 6,086,724 A | 7/2000 | Nakatani et al. | |
| 7,075,642 B2 * | 7/2006 | Koo | G01N 21/65 356/301 |
| 8,597,537 B2 * | 12/2013 | Sasaki | B41J 2/14233 252/62.9 R |
| 2009/0074611 A1 * | 3/2009 | Monzyk | C01B 15/027 422/29 |
| 2010/0015361 A1 * | 1/2010 | Negishi | C23C 14/12 427/596 |
| 2016/0201197 A1 * | 7/2016 | Monzyk | C25B 1/55 427/380 |
| 2017/0120345 A1 | 5/2017 | Patten et al. | |
| 2017/0306474 A1 * | 10/2017 | Kwak | C23C 14/5813 |

FOREIGN PATENT DOCUMENTS

| | | |
|---|---|---|
| CN | 106711304 A | 5/2017 |
| CN | 106735866 A | 5/2017 |
| CN | 106735886 A | 5/2017 |
| CN | 108526627 A | 9/2018 |
| CN | 109277691 A | 1/2019 |
| CN | 109732199 A | 5/2019 |

* cited by examiner

METHOD AND APPARATUS FOR MICROMACHINING SEMICONDUCTOR MATERIAL FROM OPPOSING SIDES THROUGH SYNCHRONOUS COORDINATION OF LASER AND ELECTROCHEMISTRY

CROSS REFERENCE TO THE RELATED APPLICATIONS

This application is the national phase entry of International Application No. PCT/CN2019/076416, filed on Feb. 28, 2019, which is based upon and claims priority to Chinese Patent Application No. 201910137952.0, filed on Feb. 25, 2019, the entire contents of which are incorporated herein by reference.

TECHNICAL FIELD

The present invention relates to a method and an apparatus for machining structures such as micro slits, holes, and trenches in the special machining field, and in particular, to a method and an apparatus for micromachining a semiconductor material from opposing sides through synchronous coordination of laser and electrochemistry.

BACKGROUND

Semiconductor materials represented by silicon and germanium have good structural and functional properties and are widely used in the fields of chips, photovoltaics, medical instruments, microelectromechanical systems, and so on. Microstructures of specific morphology can be machined on the surface of a semiconductor material to achieve multiple functions. For example, periodic micro-trench structures at submicron scale are capable of enhancing the anti-reflective properties of the material surface; smooth micro-dimples densely distributed like a honeycomb are capable of forming a micro-concave lens array; and regular microstructures on the surface help to change the hydrophilic properties of the material and achieve super-hydrophilic or super-hydrophobic functions.

Due to high brittleness and low fracture toughness, semiconductor materials have poor machinability and are even more difficult to micromachine. After years of exploration by scientific research institutions at home and abroad, gratifying progresses have been made in the micromachining of this type of materials. Micro-turning/milling, electrolysis, photolithography, chemical etching, laser machining, and so on are mainly used at present. The above machining methods have individual characteristics, applicable occasions, and limitations. For example, when monocrystalline silicon is machined by means of micro-end milling, to ensure that material removal occurs in a ductile regime to avoid cracks, a single-step feed needs to be controlled at 250 nm or less, resulting in low material removal efficiency. When an electrochemical dissolution method is adopted, due to the characteristics of semiconductor materials, their current density is generally lower than that of metal materials, resulting in lower machining efficiency. The conventional laser machining of semiconductor materials inevitably causes obvious thermal damages, while advanced ultrafast lasers represented by femtosecond lasers have disadvantages such as low removal efficiency and expensive equipment.

For the micromachining of semiconductor materials, some hybrid machining methods have also been proposed at home and abroad, wherein mechanical forces, lasers, electrochemical anodic dissolution, electrochemical discharge, chemical etching, water jet impact and other means are reasonably combined to achieve the purpose of micromachining.

It is found by searching the prior art that U.S. Patent Publication No. US2017/0120345A1 discloses a laser augmented diamond drilling method and apparatus. In this method, diamond or any other material of high hardness and good light transmission is embedded at the axle center of a metal drill bit, and a laser beam is transmitted during the machining process to heat and soften the material near the contact region of the drill bit, thereby improving the drilling efficiency and reducing the tool wear. However, the structure of embedding a diamond material in the drill bit is complicated to fabricate and makes it difficult to further reduce the diameter of the drill bit, which may limit the application of this method in the micromachining field.

Chinese Patent Publication No. CN106735866A discloses an apparatus and a method for machining a semiconductor material through combination of multifocal laser and electrochemistry from opposing sides. In this method, a tool electrode serves as a cathode and a semiconductor sample serves as an anode, and by controlling the potential between the two electrodes, electrical discharge machining at a high potential and electrochemical etching at a low potential can be implemented. Meanwhile, laser beams act on a back surface of the semiconductor sample from bottom to top to promote the electrochemical reaction. This method can improve the etching efficiency and the surface quality of through-holes, but combined machining with the laser beams and the electrodes requires accurate "tool-setting", so that the precision of the apparatus needs to be high.

Chinese Patent Publication No. CN1919514A discloses a combined machining method by using a liquid jet and a laser beam coaxial with each other, wherein based on laser machining, a high-speed liquid jet coaxial with a laser beam is used for material removal through electrolysis, so as to eliminate recast layers, microcracks, and residual stresses. In this method, metal materials are object to be machined, and properties related to semiconductor materials are not involved. Besides, limited by the jet diameter and jet quality, the quality of the laser beam is reduced when being coaxially transmitted within the jet, which makes it difficult to further reduce the machining size.

Chinese Patent Publication No. CN108526627A discloses a method for machining a semiconductor material through combination of laser and electrolysis. In this method, based on the characteristic that the electrical conductivity of a semiconductor material such as monocrystalline silicon significantly increases as the temperature rises, an external electric field is applied in the form of an electrolyte jet near a laser machining region, to implement combined machining of laser etching and electrochemical anodic dissolution on the material surface, thereby improving the machining quality of microstructures. However, in this method, since laser etching and electrochemical dissolution of a material occur on the same side of the material, the energy of an incident laser beam will be affected by an electrolyte flow. Moreover, this method does not explore the possibility of simultaneously localized machining on the opposing surfaces of the material, and its technical applicability needs to be further expanded.

SUMMARY

In the present invention, based on the characteristic that the electrical conductivity of a semiconductor material such as silicon increases as the temperature rises, a local region where the electrical conductivity increases is obtained near a machining region by short pulsed laser irradiation, and an instantaneous localized conductive channel through which a current preferentially passes is formed. Meanwhile, electrolytic machining is carried out on a back surface of the material, high-efficiency electrochemical anodic dissolution can be performed at the position with a localized increase in the electrical conductivity, and coordinated machining through the laser thermal-mechanical effect on the upper surface of the material and electrochemical anodic dissolution on the back surface of the material can be continuously implemented. Therefore, a micromachining method for precise and symmetric machining of upper and lower surfaces of a semiconductor material is obtained, which has high machining efficiency, causes small thermal damages, and achieves good surface quality, and a machining apparatus adapted to this method is also provided.

To achieve the above objective, the present invention is implemented through the following technical solutions.

A method for micromachining a semiconductor material from opposing surfaces through synchronous coordination of laser and electrochemistry is provided, wherein a laser beam is irradiated onto a semiconductor material to form a local high-temperature region in the semiconductor material, which leads to a localized increase in electrical conductivity, and the semiconductor material is connected to a positive electrode of a direct-current pulsed power supply; a negative electrode of the direct-current pulsed power supply is connected to a cathode copper plate, and the cathode copper plate and the semiconductor material are arranged in parallel with a uniform gap therebetween; an electrolyte is injected, by a needle and in the form of a low-pressure jet, into the gap between the semiconductor material and the cathode copper plate to form an electrolyte layer, such that the cathode and the anode are in electrical contact with each other; and an electrochemical anodic dissolution region on a back surface of the semiconductor material corresponds to the irradiation position of the laser beam on the upper surface.

Further, the semiconductor material is a semiconductor material whose electrical conductivity is positively correlated with temperature, preferably monocrystalline silicon or monocrystalline germanium.

Further, by adjusting the space-time distribution of energy of the laser beam, temperature field distribution near a laser irradiation region in the material can be adjusted, which leads to dynamic and localized regulation of the electrical conductivity of the material and achieves differential control of an electrochemical anodic dissolution rate on a lower surface of the semiconductor material.

Further, forced convection measures are taken on an upper surface of the semiconductor material to effectively slow down the temperature rise outside the irradiation region, so that spatial positions of high temperature-induced conductive channels are relatively concentrated, enhancing the localization of electrochemical anodic dissolution on the lower surface of the semiconductor material.

Further, corresponding microstructures are etched on the upper surface of the semiconductor material by controlling parameters such as the energy, frequency, and scanning speed of the laser beam, and the microstructures on the upper surface correspond to microstructures formed by electrochemical anodic dissolution on the opposing lower surface of the semiconductor material.

Further, corresponding inclined microstructures are machined on the upper and lower surfaces of the semiconductor material by adjusting an angle between the incident laser beam and the semiconductor material.

Further, the electrolyte in the metal needle is a high-concentration neutral saline solution with a mass fraction of 10%-30%, or an alkaline solution with a mass fraction of 4%-10% as desired.

An apparatus for micromachining semiconductor material from opposing sides through synchronous coordination of laser and electrochemistry is provided, which includes an optical path system, a stable low-pressure jet generation system, and an electrolytic machining system. The optical path system includes a laser, a beam expander, a reflector, a galvanometer, and a lens. A laser beam emitted by the laser passes through the beam expander, is then reflected by the reflector arranged at 45° to pass through the galvanometer and the lens, and is irradiated onto a semiconductor material. The electrolytic machining system includes a direct-current pulsed power supply, an adjustable cathode fixture, an electrolyte tank, a current probe, and an oscilloscope. The stable low-pressure jet generation system is used for providing an electrolyte flow into a metal needle to form a stable low-pressure jet, and the electrolyte flow forms an electrolyte layer between the semiconductor material and a cathode copper plate, such that the cathode and the anode are in electrical contact with each other.

Further, the distance between the semiconductor material and the cathode copper plate is adjustable, and the up and down fine adjustment of the position of the cathode copper plate is implemented through two fine adjustment screws in the adjustable cathode fixture; the bottom of the adjustable cathode fixture is mounted on a base, the base includes a spherical universal adjustment member for adjusting a spatial angle between the semiconductor material and the cathode copper plate to obtain different laser incident angles, and the spherical universal adjustment member is locked by a locking device; the base is arranged in the electrolyte tank; the electrolyte tank is arranged on an X-Y-Z linear motion platform, and is movable under the control of a computer and a motion control card.

Further, the laser is a conventional nanosecond pulsed laser or a picosecond/femtosecond ultrashort pulsed laser.

Beneficial Effects:

(1) To solve the problem that the machinability of a semiconductor material such as monocrystalline silicon is poor, based on the characteristic that the electrical conductivity of the semiconductor material such as monocrystalline silicon increases as the temperature rises, a method for synchronously machining front and back surfaces of a semiconductor material can be implemented through dynamic synchronous coordination of the laser thermal-mechanical effect and the electrochemical anodic dissolution. In this method, the laser etching efficiency is high on the front surface; and no residual stress or thermal damage occurs in the microstructures obtained by electrolytic machining on the back surface, and the microstructures have good surface quality. This method solves the problem that it is difficult to machine a large number of structures such as micro slits, holes, and trenches in the packaging and cutting of integrated circuit chips as well as the machining and manufacturing of semiconductor micro-parts in a microelectromechanical system.

(2) In the present invention, based on the characteristic that the electrical conductivity of the semiconductor material such as monocrystalline silicon is sensitive to temperature, a localized conductive channel is produced in the material by a focused laser beam, and meanwhile electrolytic machining is performed on the back surface of the semiconductor material, so that rapid electrochemical anodic dissolution occurs on the region of the back surface of the material corresponding to the laser irradiation position, while the other regions are not dissolved or are dissolved with low efficiency. Therefore, the incident laser beam on the upper surface can be used to control the electrolytic machining on the back surface of the material. The microstructures obtained by electrolytic machining on the back surface depend on the geometrical shape, space-time distribution of energy, scanning path, and the like of the incident laser beam, and drilling, grooving, patterning, and the like can be implemented without using any specific cathode tool.

(3) In the present invention, based on the characteristic that the electrical conductivity of the semiconductor material such as monocrystalline silicon is sensitive to temperature, a local high-temperature region obtained by laser irradiation in the material is transformed into a region with high electrical conductivity, and a localized conductive channel through which a current preferentially passes is formed, wherein the current density in the conductive channel is much greater than that of the surrounding material region at normal temperature. Therefore, the electrochemical anodic dissolution is limited to be near the laser irradiation region, and dynamic synchronous coordination of machining through the laser thermal effect on the front surface and the electrochemical anodic dissolution on the back surface is realized, so that the machining localization is enhanced, the machining quality is improved, and the defect that the implementation of coordinated machining heavily relies on "tool-setting" is eliminated. Besides, in the laser pulse interval, the high-temperature region in the material still lasts for a period of time due to continuity of changes in the temperature field during the cooling process, so that localized electrolytic machining can be continuously performed and the electrochemical dissolution efficiency is improved.

(4) The machining system of the present invention has perfect functions and is easy to assemble and implement. The devices designed for adjusting the positions of the cathode and the anode and the angles therebetween have simple structures and can be easily mounted and maintained.

Reference Signs

1. laser generator, 2. laser beam, 3. beam expander, 4. reflector, 5. galvanometer, 6. lens, 7. stable low-pressure jet generation system, 8. metal needle, 9. semiconductor material, 10. cathode copper plate, 11. fine adjustment screw, 12. adjustable cathode fixture, 13. universal adjustment base, 14. X-Y-Z linear motion platform, 15. locking device, 16. electrolyte tank, 17. motion control card, 18. oscilloscope, 19. current probe, 20. direct-current pulsed power supply for electrolysis, 21. computer, 22. instantaneous localized conductive channel, 23. hydrogen bubble, 24. electrolyte layer, 25. electrolytic machining micro-hole, 26. electrolyte cylinder, 27. piston, 28. piston rod, 29. slider, 30. ball screw, 31. first support seat, 32. servo motor, 33. coupling, 34. second support seat, 35. second check valve, 36. electrolyte storage tank, 37. filter, 38. XYZ three-way adjustment platform, 39. jet angle adjuster, 40. adjustable connecting rod, 41. hose, 42. first check valve.

DETAILED DESCRIPTION OF THE EMBODIMENTS

The present invention is further described below with reference to the accompanying drawings for better understanding.

Figure 1:
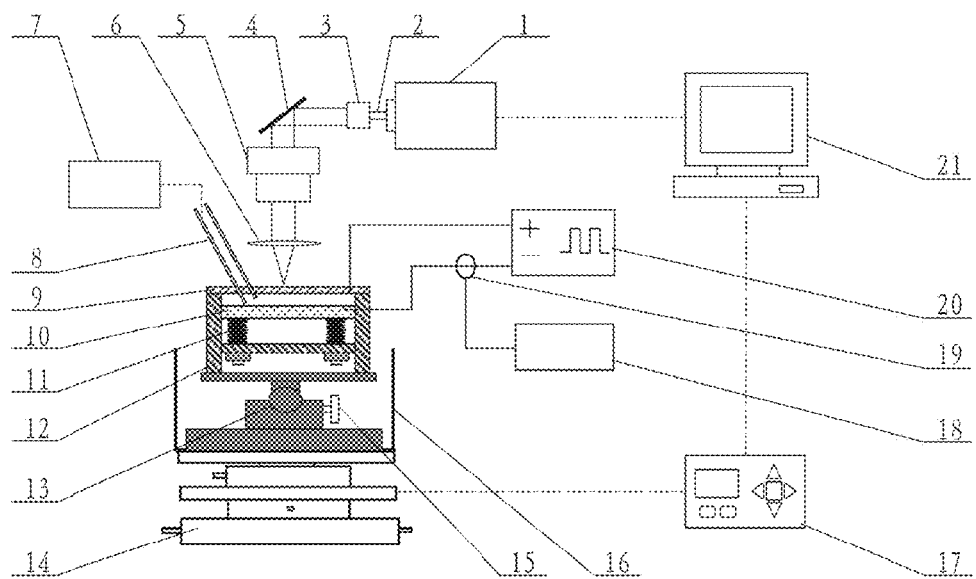
FIG. 1 is a schematic diagram of a system that implements the opposing micromachining method through synchronous coordination of laser and electrolysis according to the present invention.
Figure 2:
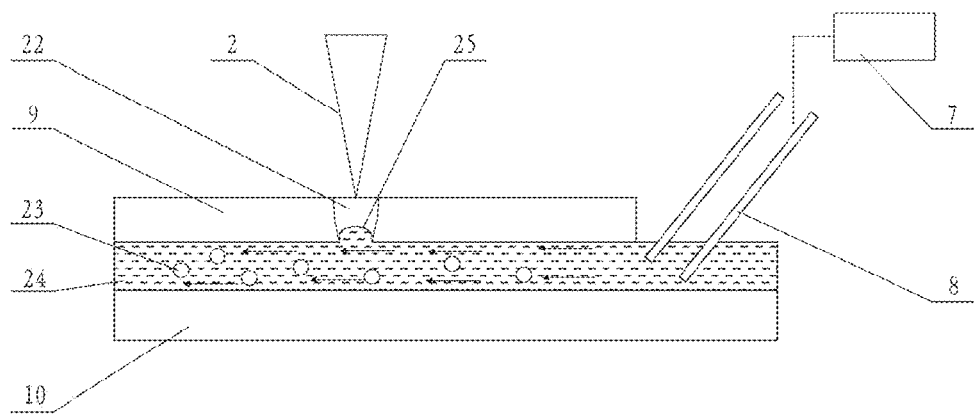
FIG. 2 is a schematic diagram illustrating the principle of the opposing micromachining method through synchronous coordination of laser and electrolysis according to the present invention.

FIG. 1 and FIG. 2 illustrate a method for micromachining a semiconductor material from opposing sides through synchronous coordination of laser and electrochemistry, wherein based on the characteristic that the electrical conductivity of a semiconductor material significantly increases as the temperature rises, a local temperature field is produced by a focused laser beam, and meanwhile electrochemical anodic dissolution is performed on a back surface of the material, thereby achieving high-efficiency localized electrolytic machining on the back surface of the material to obtain high-quality microstructures such as holes and trenches without recast layers and residual stresses. A laser beam 2 emitted by a laser generator 1 is irradiated onto a semiconductor material 9 to form a local high-temperature region in the material, thereby achieving a localized increase in electrical conductivity. The semiconductor material 9 is connected to a positive electrode of a direct-current pulsed power supply 20. A negative electrode of the direct-current pulsed power supply 20 is connected to a cathode copper plate 10. The cathode copper plate 10 has a flat surface and is arranged in parallel with the semiconductor material 9 so that the gap therebetween is uniform. An electrolyte is injected, by a needle 8 and in the form of a low-pressure jet, into the gap between the anode semiconductor material 9 and the cathode copper plate 10 to form an electrolyte layer 24, such that the cathode and the anode are in electrical contact with each other. The electrochemical anodic dissolution region on the back surface of the semiconductor material 9 corresponds to an irradiation position of the laser beam 2.

The semiconductor material is a semiconductor material whose electrical conductivity is positively correlated with temperature, including but not limited to monocrystalline silicon and monocrystalline germanium.

By adjusting the space-time distribution of energy of the incident laser beam, temperature field distribution near a laser irradiation region in the material can be adjusted, which leads to dynamic and localized regulation of the electrical conductivity of the material and achieves differential control of an electrochemical anodic dissolution rate on a lower surface of the semiconductor material 9.

Forced convection measures, such as adding a flowing water layer or blowing a cooling gas, can be taken on an upper surface of the semiconductor material 9 to effectively slow down the temperature rise outside the irradiation region, so that spatial positions of high temperature-induced conductive channels are relatively concentrated, enhancing the localization of electrochemical anodic dissolution on the lower surface of the semiconductor material 9.

The space-time distribution of the conductive channel in the material can be dynamically adjusted by means of motion path planning of the laser beam, regulation of the space-time distribution of energy of the incident laser beam, and the like, to implement different machining manners such as electrolytic drilling, grooving, and two-dimensional patterning on the bottom of the semiconductor material 9.

The electrochemical anodic dissolution region on the bottom of the semiconductor material 9 precisely corresponds to the shape of the incident laser beam. The shape of the incident beam can be adjusted by means of splitting, shaping, masking, and the like to machine a corresponding shape on the bottom of the semiconductor material 9, including but not limited to using an array of incident light spots to machine a micro-hole array on the bottom of the semiconductor material 9 at a time; using a hollow incident beam to machine a circular ring feature on the bottom of the semiconductor material 9 at a time; and using a patterned incident beam to machine a corresponding pattern on the bottom of the semiconductor material 9 at a time. Specific microstructures can be etched on the upper surface of the semiconductor material 9 by controlling parameters such as the energy, frequency, and scanning speed of the laser beam, and the microstructures precisely correspond to microstructures formed by electrochemical anodic dissolution on the lower surface of the semiconductor material 9.

Precisely corresponding inclined microstructures are machined on the upper and lower surfaces of the semiconductor material 9 by adjusting an angle between the incident laser beam 2 and the semiconductor material 9. The electrolyte in the metal needle 8 is a high-concentration neutral saline solution with a mass fraction of 10%-30%, or an alkaline solution with a mass fraction of 4%-10% as desired.

FIG. 1 illustrates an apparatus for micromachining a semiconductor material from opposing sides through synchronous coordination of laser and electrochemistry. The apparatus includes an optical path system, a stable low-pressure jet generation system 7, and an electrolytic machining system. The optical path system includes a laser generator 1, a beam expander 3, a reflector 4, a galvanometer 5, and a lens 6. The laser beam 2 emitted by the laser generator 1 passes through the beam expander 3, is then reflected by the reflector 4 arranged at 45° to pass through the galvanometer 5 and the lens 6, and is irradiated onto the semiconductor material 9. The electrolytic machining system includes a direct-current pulsed power supply 20, an adjustable cathode fixture 12, an electrolyte tank 16, a current probe 19, and an oscilloscope 18. The stable low-pressure jet generation system 7 is used for providing an electrolyte flow into the metal needle 8 to form a stable low-pressure jet. The electrolyte forms an electrolyte layer between the semiconductor material 9 and the cathode copper plate 10, such that the cathode and the anode are in electrical contact with each other. During the electrolytic process, hydrogen gas is produced on the cathode copper plate 10 to cause hydrogen bubbles 23, and low-pressure jet impact can be used to effectively remove the bubbles to avoid gathering of the bubbles.

The semiconductor material 9 and the cathode copper plate 10 are both arranged on the adjustable cathode fixture 12. The up and down fine adjustment of the position of the cathode copper plate can be implemented through two fine adjustment screws 11 in the adjustable cathode fixture 12. The bottom of the adjustable fixture is mounted on a base 13. The base 13 includes a spherical universal adjustment member for adjusting a spatial angle between the semiconductor material 9 and the cathode copper plate 10 to obtain different laser incident angles. The spherical universal adjustment member is locked by a locking device 15. The base 13 is arranged in the electrolyte tank 16, and used for recycling the electrolyte to avoid environmental contamination. The electrolyte tank 16 is arranged on an X-Y-Z linear motion platform 14, and is movable under the control of a computer 21 and a motion control card 17.

The laser generator 1 may be a conventional nanosecond pulsed laser or a picosecond/femtosecond ultrashort pulsed laser. The ultrashort pulsed laser helps to concentrate the temperature field in the material, to further enhance the localization of electrolytic machining on the lower surface of the material and improve the machining quality.

Figure 3:
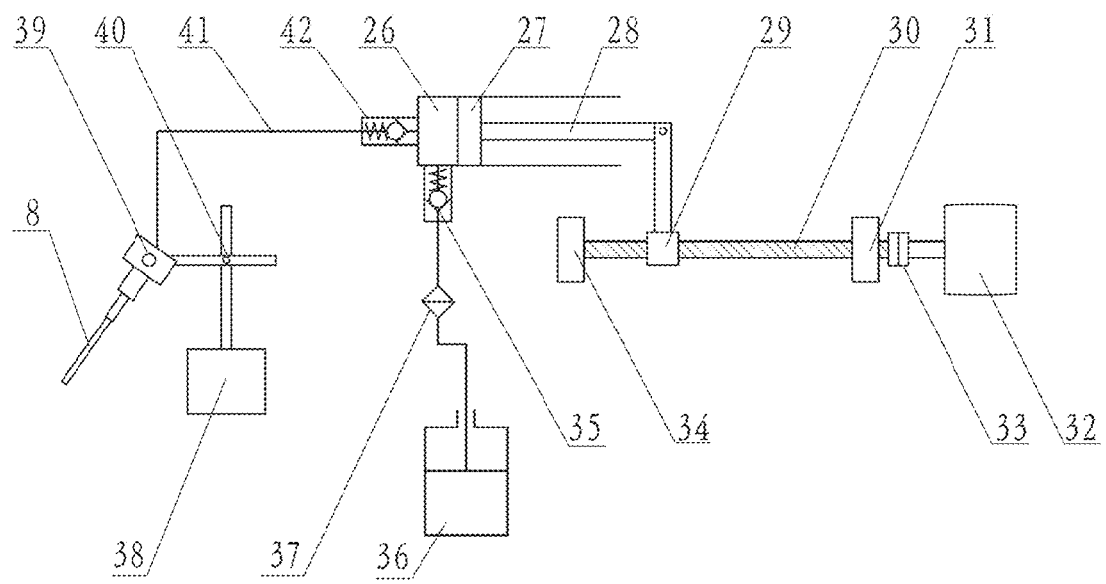
FIG. 3 is a schematic structural diagram of a stable low-pressure jet generation system mentioned in FIG. 1 of the present invention.

FIG. 3 illustrates an embodiment of a stable low-pressure jet generation and adjustment system. A servo motor 32 drives, through a coupling 33, a ball screw 30 to rotate, and two ends of the ball screw 30 are supported by a first support seat 31 and a second support seat 34. The rotation of the ball screw 30 is transformed into the linear motion of a piston rod 28 through a slider 29 matched with the ball screw 30, to facilitate output of an electrolyte from an electrolyte cylinder 26 at a constant speed. The electrolyte flows through a first check valve 42 and a hose 41 into the metal needle 8, to form a stable low-pressure jet. The angle of the low-pressure jet can be adjusted by an angle adjuster 39, and the jet impact position can be adjusted by an XYZ three-way fine adjustment platform 38. The electrolyte is output and taken in through the first check valve 42 and a second check valve 35 along with the forward and backward movement of the ball screw 30. When the servo motor 32 drives, through the ball screw 30, the piston rod 28 to move forward, the first check valve 42 is opened and the second check valve 35 is closed, and the electrolyte is pushed by the piston 27 into the hose 41. When the servo motor 32 drives, through the ball screw 30, the piston rod 28 to move backward, the first check valve 42 is closed and the second check valve 35 is opened, and the electrolyte in an electrolyte storage tank 36 passes through a filter 37 and is drawn into the electrolyte cylinder 26.

Embodiment 1

Referring to FIG. 2, this embodiment provides a method for micromachining a semiconductor material from opposing sides through synchronous coordination of laser and electrolysis based on a localized conductive channel. The laser beam 2 emitted by the laser generator 1 is adjusted and transmitted by an external optical path and is then focused on the surface of the semiconductor material 9, so that high-efficiency material removal is performed by using the laser thermal-mechanical effect to obtain micro-holes and micro-trenches. Meanwhile, a local temperature field is generated around the irradiation region due to the laser thermal effect, and a localized increase in the electrical conductivity of the semiconductor material such as monocrystalline silicon is achieved. On this basis, a stable low-pressure electrolyte jet generation apparatus is used to generate a low-pressure electrolyte jet on a back surface of the semiconductor material 9, and localized electrochemical anodic dissolution is implemented in a region where the electrical conductivity increases, so that microstructures corresponding to laser etching on the upper surface are obtained on the back surface of the material, and no thermal damage and no residual stresses are caused. The electrolyte is a neutral saline solution or an alkaline solution such as sodium hydroxide. The neutral saline solution is a neutral saline solution with a proper concentration and has a mass fraction of 10%-30%; while the sodium hydroxide solution has a mass fraction of 4%-10%.

Embodiment 2: This embodiment provides a system for micromachining a semiconductor material from opposing sides through synchronous coordination of laser and electrolysis based on a localized conductive channel. The system includes the optical path system, the stable low-pressure jet generation system, and the electrolytic machining system. The optical path system includes the laser generator 1 and an external optical path. The external optical path includes the beam expander 3, the reflector 4, the galvanometer 5, and the lens 6. The laser beam 2 is emitted by the laser generator 1, the diameter of the laser beam is enlarged by the beam expander 3, the direction of the laser beam is adjusted by the reflector 4, the motion of the laser beam is controlled by the galvanometer 5, and the laser beam is finally focused by the lens 6 and irradiated onto the surface of the semiconductor material 9, to form a localized conductive channel 22 in the semiconductor material 9. The generation of the laser beam 2 and the motion of the galvanometer 5 are both controlled by the computer 21.

This embodiment further includes the stable low-pressure jet generation system 7, which generates an electrolyte flowing at a constant speed. The electrolyte flows through the metal needle 8 to become a stable low-pressure jet, which is injected into the gap between the semiconductor material 9 and the cathode copper plate 10 to form the thin electrolyte layer 24. This embodiment further includes the electrolyte tank 16, which facilitates the recycling of the electrolyte.

This embodiment further includes the electrolytic machining system which includes the direct-current pulsed power supply 20. A negative electrode of the direct-current pulsed power supply is connected to the cathode copper plate 10, a positive electrode of the direct-current pulsed power supply is connected to the semiconductor material 9, and the semiconductor material 9 and the cathode copper plate 10 have a uniform gap therebetween. After the low-pressure electrolyte jet is passed into the metal needle 8 such that the cathode and the anode are in electrical contact with each other, the electrical conductivity near the laser irradiation region increases, and a current preferentially passes through this region, which leads to a localized increase in the electrochemical anodic dissolution rate and achieves material removal to obtain a micro-hole 25.

This embodiment further includes an electrolytic machining process detection system which includes the current probe 19, and detected signal changes can be presented by the oscilloscope 18.

The above descriptions are preferred embodiments of the present invention, and are not intended to limit the present invention. Any obvious improvements, replacements, or modifications made by persons skilled in the art without departing from the essence of the present invention shall fall within the protection scope of the present invention.

What is claimed is:

1. A method for micromachining a semiconductor material from opposing sides through synchronous coordination of laser and electrochemistry, comprising:
    irradiating an incident laser beam onto the semiconductor material to form a local high-temperature region in the semiconductor material to obtain a localized increase in electrical conductivity, and connecting the semiconductor material serving as an anode to a positive electrode of a direct-current pulsed power supply;
    connecting a negative electrode of the direct-current pulsed power supply to a cathode copper plate, and arranging the cathode copper plate and the semiconductor material in parallel with a gap between the semiconductor material and the cathode copper plate; and
    injecting an electrolyte, by a metal needle and in a form of a low-pressure jet, into the gap between the semiconductor material and the cathode copper plate to form an electrolyte layer, wherein a cathode and the anode are in electrical contact with each other; and an electrochemical anodic dissolution region on a back surface of the semiconductor material corresponds to an irradiation position of the incident laser beam.

2. The method for micromachining the semiconductor material from the opposing sides through the synchronous coordination of the laser and the electrochemistry according to claim 1, wherein
    the semiconductor material has the electrical conductivity positively correlated with a temperature, and
    the semiconductor material is monocrystalline silicon or monocrystalline germanium.

3. The method for micromachining the semiconductor material from the opposing sides through the synchronous coordination of the laser and the electrochemistry according to claim 1, wherein
    by adjusting a space-time distribution of energy of the incident laser beam, a temperature field distribution near a laser irradiation region in the semiconductor material is adjusted to implement dynamic and localized regulation of the electrical conductivity of the semiconductor material, to implement differential control of an electrochemical anodic dissolution rate on a lower surface of the semiconductor material.

4. The method for micromachining the semiconductor material from the opposing sides through the synchronous coordination of the laser and the electrochemistry according to claim 1, wherein
    forced convection measures are taken on an upper surface of the semiconductor material to slow down a temperature rise outside an irradiation region, and spatial positions of high temperature-induced conductive channels are relatively concentrated to enhance localization of an electrochemical anodic dissolution on a lower surface of the semiconductor material.

5. The method for micromachining the semiconductor material from the opposing sides through the synchronous coordination of the laser and the electrochemistry according to claim 1, wherein
    microstructures are etched on an upper surface of the semiconductor material by controlling parameters comprising energy, a frequency, and a scanning speed of the incident laser beam, and the microstructures obtained by laser etching on the upper surface correspond to microstructures formed by an electrochemical anodic dissolution on a lower surface of the semiconductor material.

6. The method for micromachining the semiconductor material from the opposing sides through the synchronous coordination of the laser and the electrochemistry according to claim 1, wherein
    inclined microstructures are machined on an upper surface and a lower surface of the semiconductor material by adjusting an angle between the incident laser beam and the semiconductor material.

7. The method for micromachining the semiconductor material from the opposing sides through the synchronous coordination of the laser and the electrochemistry according to claim 1, wherein the electrolyte in the metal needle is a high-concentration neutral saline solution with a mass fraction of 10%-30%, or an alkaline solution with a mass fraction of 4%-10%.

8. An apparatus for micromachining a semiconductor material from opposing sides through synchronous coordination of laser and electrochemistry, comprising:
an optical path system, a stable low-pressure jet generation system, and an electrolytic machining system, wherein
the optical path system comprises a laser generator, a beam expander, a reflector, a galvanometer, and a lens;
a laser beam emitted by the laser generator passes through the beam expander, the laser beam is then reflected by the reflector arranged at 45° to pass through the galvanometer and the lens, and the laser beam is irradiated onto the semiconductor material;
the electrolytic machining system comprises a direct-current pulsed power supply, an adjustable cathode fixture, an electrolyte tank, a current probe, and an oscilloscope;
the stable low-pressure jet generation system is configured for providing an electrolyte flow into a metal needle to form a stable low-pressure jet, and the electrolyte flow forms an electrolyte layer between the semiconductor material and a cathode copper plate, and a cathode and an anode are in electrical contact with each other.

9. The apparatus for micromachining the semiconductor material from the opposing sides through the synchronous coordination of the laser and the electrochemistry according to claim 8, wherein
the semiconductor material and the cathode copper plate are both arranged on the adjustable cathode fixture, and an up and down fine adjustment of a position of the cathode copper plate is implemented through two fine adjustment screws in the adjustable cathode fixture;
a bottom of the adjustable cathode fixture is mounted on a base,
the base comprises a spherical universal adjustment member for adjusting a spatial angle between the semiconductor material and the cathode copper plate to obtain different laser incident angles, and the spherical universal adjustment member is locked by a locking device;
the base is arranged in the electrolyte tank; and
the electrolyte tank is arranged on an X-Y-Z linear motion platform, and the electrolyte tank is moved under a control of a computer and a motion control card.

10. The apparatus for micromachining the semiconductor material from the opposing sides through the synchronous coordination of the laser and the electrochemistry according to claim 8, wherein
the laser generator is a nanosecond pulsed laser generator or a picosecond/femtosecond ultrashort pulsed laser generator.

* * * * *